(12) United States Patent
Liaw

(10) Patent No.: US 6,258,678 B1
(45) Date of Patent: Jul. 10, 2001

(54) USE OF A WET ETCH DIP STEP USED AS PART OF A SELF-ALIGNED CONTACT OPENING PROCEDURE

(75) Inventor: Jhon-Jhy Liaw, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/365,984

(22) Filed: Aug. 2, 1999

(51) Int. Cl.$^7$ .................................................. H01L 21/336
(52) U.S. Cl. ..................... 438/303; 438/639; 438/672; 438/723; 438/757
(58) Field of Search ................................ 438/229, 299, 438/301, 303, 704, 637, 639, 257, 757, 723, 963, 320, 339, 364, 592, 624, 672, 564, 622, 649, 684; 257/758

(56) References Cited

U.S. PATENT DOCUMENTS

| | | | |
|---|---|---|---|
| 4,837,176 | * 6/1989 | Zdebel et al. | 437/31 |
| 4,997,790 | * 3/1991 | Woo et al. | 437/195 |
| 5,219,793 | * 6/1993 | Cooper et al. | 437/195 |
| 5,431,778 | 7/1995 | Dahm et al. | 156/662.1 |
| 5,597,983 | 1/1997 | Nguyen et al. | 174/264 |
| 5,731,236 | * 3/1998 | Chou et al. | 438/253 |
| 5,744,024 | 4/1998 | Fukazawa et al. | 438/734 |
| 5,804,506 | * 9/1998 | Haller et al. | 438/649 |
| 5,865,900 | 2/1999 | Lee et al. | 134/12 |
| 5,880,019 | 3/1999 | Hsieh et al. | 438/666 |
| 6,057,581 | * 5/2000 | Doan | 257/401 |
| 6,077,776 | * 6/2000 | Cho et al. | 438/647 |
| 6,093,641 | * 7/2000 | Park | 438/639 |
| 6,110,792 | * 8/2000 | Bronner et al. | 438/386 |
| 6,136,658 | * 10/2000 | Shinmura | 438/305 |
| 6,165,880 | * 12/2000 | Yaung et al. | 438/592 |
| 6,174,774 | * 1/2001 | Lee | 438/279 |

OTHER PUBLICATIONS

Wolf and Tauber; Silicon Processing for the VLSI Era vol. 1: Process Technology; Lattice Press, 1986; pp. 539–567.*
Wolf, Stanley; Silicon Processing for the VLSI Era vol. 2: Process Integration; Lattice Press, 1990; pp. 104, 105, 194.*

* cited by examiner

Primary Examiner—Wael Fahmy
Assistant Examiner—Fernando Toledo
(74) Attorney, Agent, or Firm—George O. Saile; Stephen B. Ackerman

(57) ABSTRACT

A process for forming a SAC opening, in a composite insulator layer, to expose an active device region in a semiconductor substrate, has been developed. The process features a RIE procedure, used to selectively define a first portion of the SAC opening, in a thick silicon oxide layer, with the RIE procedure terminating at the appearance of a polymer material, formed on the surface of an underlying, thin silicon nitride stop layer, at the conclusion of thick silicon oxide, dry etching procedure. A critical wet etch procedure, performed in a dilute hydrofluoric acid solution, is then employed to remove the polymer material, allowing selective removal of the thin silicon nitride stop layer to be accomplished, resulting in the desired SAC opening. A buffered hydrofluoric acid dip, is then used to remove a thin silicon oxide layer, located at the bottom of the SAC opening, followed by the formation of a self-aligned contact structure, in the SAC opening, overlying, and contacting, an active device region, in the semiconductor substrate, located at the bottom of the SAC opening.

26 Claims, 4 Drawing Sheets

USE OF A WET ETCH DIP STEP USED AS PART OF A SELF-ALIGNED CONTACT OPENING PROCEDURE

BACKGROUND OF THE INVENTION (1) Field of the Invention

The present invention relates to precesses used to fabricate semiconductor devices, and more specifically to a process used to create a self-aligned contact, (SAC), structure, for a semiconductor device.

(2) Description of Prior Art

The semiconductor industry is continually striving to increase the performance of semiconductor chips, while still attempting to decrease the manufacturing cost of these same, higher performing, semiconductor chips. The advent of micro-miniaturization, or the creation of semiconductor chips comprised with sub-micron features, have allowed these performance and cost objectives to be partially realized. The use of sub-micron features have resulted in decreases in performance degrading, junction capacitances, allowing the desired performance enhancements to be realized. In addition the use of sub-micron features allow smaller semiconductor chips, still containing device densities, equal, or greater to device densities achieved with larger semiconductor chips, to be realized. The attainment of the smaller semiconductor chip allows a greater number of chips to be obtained from a specific size starting substrate, thus reducing the processing cost of a specific semiconductor chip.

Advances in specific semiconductor disciplines, such as photolithography, and dry etching, have been major contributors to micro-miniaturization, however structural innovations, such as the use of self-aligned contact, (SAC), openings, and SAC structures, have also played a vital role in achieving the performance and cost objectives of the semiconductor industry. The use of SAC opening, allows a conductive structure, to be fully landed on an underlying active device region. For example if a design called for a metal structure to be fully landed on a source/drain region, of a metal oxide semiconductor field effect transistor, (MOSFET), device, the area of the source/drain region would have to be designed large enough to accommodate any possible misalignment of the contact or via hole, used to accommodate the fully landed metal structure, to the underlying source/drain region. The use of this additional real estate, increases the size of the semiconductor chip. The SAC opening, in an insulator layer, however is formed between silicon nitride capped, gate structures, exposing a source/drain region located between the silicon nitride gate structures. Therefore the SAC opening, formed between gate structures, and accomplished via a high etch rate ratio of silicon oxide to silicon nitride, is designed with a diameter larger than the space between the silicon nitride capped, gate structures, thus insuring fully landed SAC structures, to underlying source/drain regions. This in turn allows designers to use a smaller area for the source/drain region, guarantying fully landed SAC structures, thus allowing smaller semiconductor chips to be obtained.

The procedure for creating a SAC opening, in an insulator layer such as silicon oxide, is dependent on the selectivity, or etch rate ratio, of silicon oxide to silicon nitride. A thin layer of silicon nitride is therefore used as an etch stop during the formation of the first phase of SAC opening, in the silicon oxide layer, preventing attack of the active device region, after complete removal of the silicon oxide component. However the selectivity of silicon oxide to silicon nitride, is obtained via the formation of a polymer layer, on the surface of the thin silicon nitride layer, exposed at the conclusion of the silicon oxide etch cycle. If this polymer layer is not effectively removed, subsequent removal of the thin silicon nitride layer can not be adequately accomplished, resulting in unwanted resistance between a subsequent SAC structure, and the underlying source/drain region. This invention will describe a SAC opening procedure, featuring a wet etch cycle, used to insure complete removal of the polymer layer, formed on the thin silicon nitride layer during the SAC opening formation. Prior art, such as Lee et al, in U.S. Pat. No. 5,865,900, describe a procedure in which a series of dry etch cycles are used to remove polymer from surfaces of a silicon oxide layer, with the polymer formed during a metal patterning procedure. That prior art however does not teach the wet etch cycle, featured in this invention, and used as apart of SAC opening procedure, removing polymer from the surface of a thin silicon nitride etch stop layer.

SUMMARY OF THE INVENTION

It is an object of this invention to form a self-aligned contact, (SAC), structure, in SAC opening, to overlay and contact, a MOSFET active device region, located in a semiconductor substrate.

It is another object of this invention to perform a first phase of the SAC opening procedure, in a silicon oxide layer, via a selective dry etching procedure, using a thin underlying silicon nitride layer, as an etch stop.

It is still another object of this invention, to perform a second phase of the SAC opening procedure, to remove polymer formed on the surface of the thin silicon nitride layer at the conclusion the first phase of the SAC opening, using a wet etch procedure.

It is still yet another object of this invention to perform a third phase of the SAC opening procedure, to remove exposed regions of the thin silicon nitride layer.

In accordance with the present invention a method of forming a SAC structure, in a SAC opening, wherein the SAC opening procedure features the use of a wet etch cycle, used to remove polymer formed on an underlying silicon nitride layer, used as an etch stop during the formation of the SAC opening in an overlying silicon oxide layer, is described. After formation of silicon nitride capped gate structures, on an underlying gate insulator layer, a lightly doped source/drain region is formed in a region of the semiconductor substrate, located between, and not covered by, the silicon nitride capped gate structures. After formation of a thin silicon oxide layer, on the exposed surfaces of the silicon nitride capped gate structures, and on the surface of the lightly doped source/drain region, silicon nitride spacers are formed on the sides of the silicon nitride capped gate structures, followed by the formation of a heavily doped source/drain region, in an area of the semiconductor substrate, not covered by the silicon nitride capped gate structure or by the silicon nitride spacers. A thin silicon nitride layer, and a thick silicon oxide, interlevel dielectric layer, (ILD), are next deposited, followed by the formation of a SAC opening, in the ILD layer, selectively formed via a dry etching cycle, terminating at the appearance of the thin silicon nitride layer, and at the appearance of a polymer deposit, formed on the top surface of the thin silicon nitride layer. A wet etch cycle is next used to selectively remove polymer deposit from the surface of the thin silicon nitride layer. A final phase of the SAC opening is then performed, removing regions of the thin silicon nitride layer, exposed in the SAC opening. After a wet etch dip, used to remove the thin silicon oxide layer, residing on the surface of the heavily doped source/drain region, a SAC structure, is formed in the SAC opening, overlying and contacting, the top surface of the heavily doped source/drain region, located at the bottom of the SAC opening.

BRIEF DESCRIPTION OF THE DRAWINGS

The object and other advantages of thins invention are best described in the preferred embodiments with reference to the attached drawings that include.

DESCRIPTION OF THE PREFERRED EMBODIMENTS

The method of forming a SAC opening in a silicon oxide—silicon nitride, composite insulator layer, featuring the use of a wet etch procedure, used as a component of the SAC opening procedure, to remove polymer formed on the surface of the underlying silicon nitride stop layer during a selective dry etch procedure, employed to create the SAC opening shape in the overlying silicon oxide layer, will now be described in detail. The SAC opening procedure, described is invention, can be applied to many semiconductor chip designs, such as static random access memory, (SRAM), designs, in which both N channel, (NFET), as well as P channel, (PFET), devices, are employed. However for this invention, the novel SAC opening procedure, will be described as applied to NFET devices.

Figure 1:
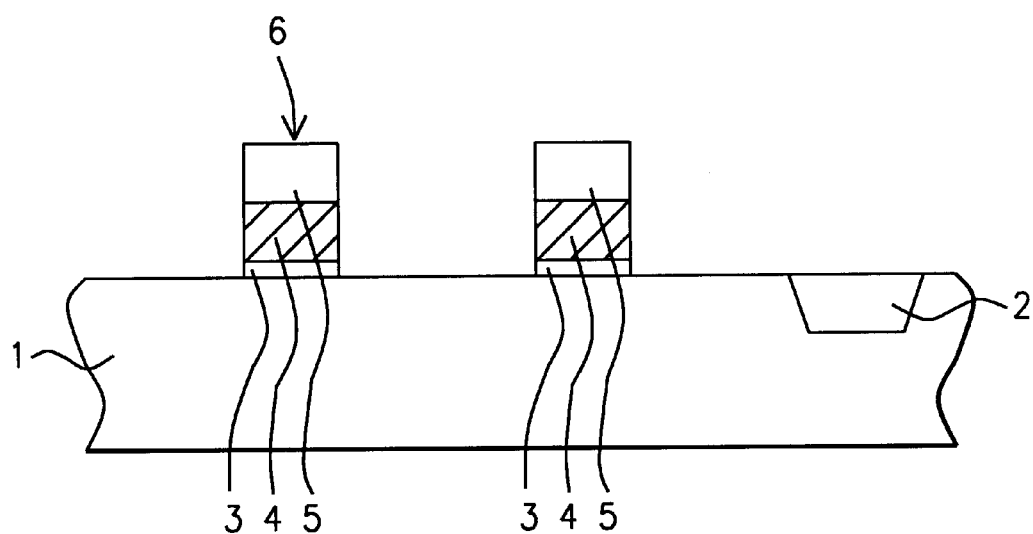
FIGS. 1–8 which schematically, in cross-sectional style, describe key stages of fabrication used to create a SAC structure, in a SAC opening, in which a wet etch cycle is used as a component of the SAC opening procedure, to remove polymer formed during the SAC opening, dry etching procedure.

A P type, semiconductor substrate 1, comprised of single crystalline silicon, with a <100> crystallographic orientation, is used and schematically shown in FIG. 1. Isolation region 2, comprised of an insulator filled shallow trench, or a thermally grown, field oxide, (FOX), region, is also schematically shown in FIG. 1. A gate insulator layer 3, comprised of silicon dioxide, is next formed via thermal oxidation procedures, at a thickness between about 15 to 200 Angstroms. Polysilicon layer 4, is then deposited via low pressure chemical vapor deposition, (LPCVD), procedures, at a thickness between about 500 to 2000 Angstroms. Polysilicon layer 4, can be doped in situ, during deposition, via the addition of arsine, or phosphine, to a silane ambient, or polysilicon layer 4, can be deposited intrinsically, then doped via ion implantation of arsenic or phosphorous ions. Silicon nitride layer 5, is next formed, at a thickness between about 1000 to 2500 Angstroms, via LPCVD or via plasma enhanced chemical vapor deposition, (PECVD), procedures, to be used as a hard mask layer, for a subsequent gate structure. Conventional photolithographic and reactive ion etching, (RIE), procedures, using $Cl_2$ as an etchant, are employed to create silicon nitride capped gate structures 6, schematically shown in FIG. 1, comprised of silicon nitride layer 5, and underlying polysilicon layer 4, on gate insulator layer 3. If lower word line resistance is required, polysilicon layer 4, can be replaced with a polycide, (metal silicide—polysilicon), layer. The photoresist shape, used to define silicon nitride capped gate structures 6, is removed via plasma oxygen ashing and careful wet clean procedures, with the wet clean component removing the regions of gate insulator layer 3, not underlying silicon nitride capped gate structures 6.

Figure 2:
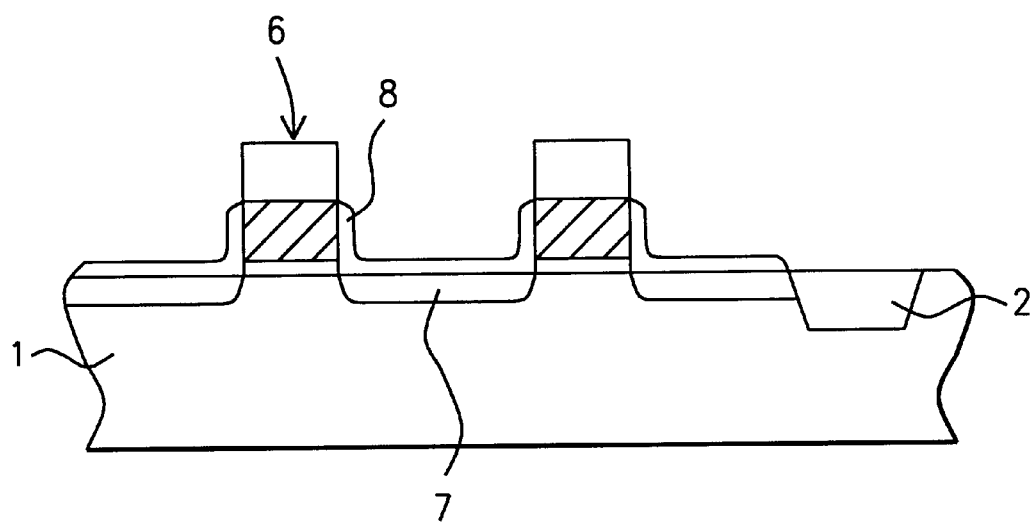

An N type, lightly doped source/drain, (LDD), region 7, is formed in an area of semiconductor substrate 1, not covered by silicon nitride capped gate structures, via an ion implantation procedure, performed at an energy between about 5 to 50 KeV, at a dose between about 5E12 to 5E14 atoms/$cm^2$, using arsenic or phosphorous ions. If this invention is applied to a SRAM design, P type, LDD regions would also be created in an area of the semiconductor substrate used for the SRAM PFET devices. This would entail initially forming an N well region, in an area of semiconductor substrate 1, to be used for the SRAM PFET devices, with the P type, LDD regions, formed in the N well region. A photoresist block out shape would be used to protect the PFET region during the formation of the N type, LDD regions, in the NFET device region, while a second photoresist block out shape would be used to protect the NFET region from the ion implantation procedures, used to create the P type, LDD regions, in the PFET device region. However the description of this invention, and the accompanying drawings, will be limited to only NFET devices. An anneal procedure, performed in an oxygen—steam ambient, at a temperature between about 750 to 900° C., is next addressed, resulting in the formation of thin silicon oxide layer 8, at a thickness between about 30 to 300 Angstroms, located on the sides of the polysilicon component of silicon nitride capped gate structures 6, and located on the top surface of LDD region 7. This is shown schematically in FIG. 2. This anneal procedure, and the formation of thin silicon oxide layer 8, is optional.

Figure 3:
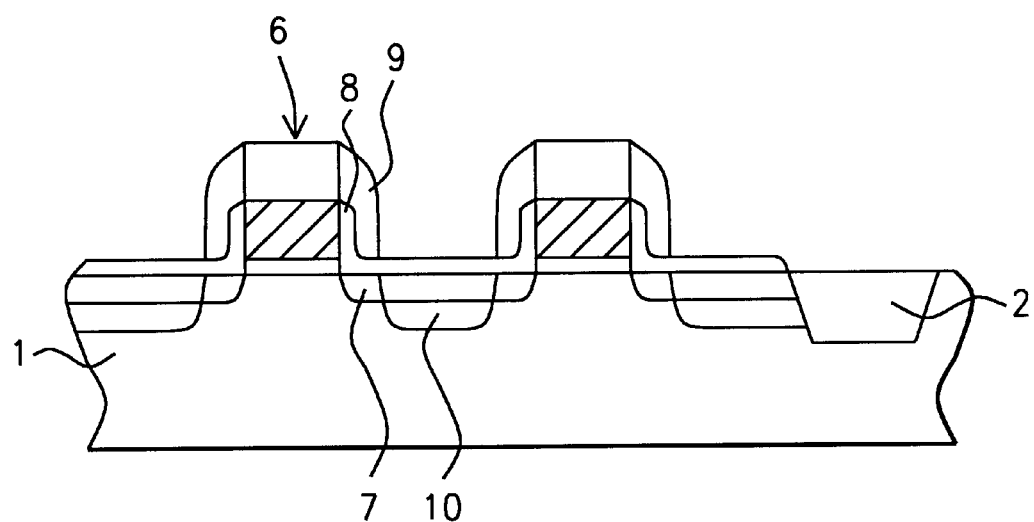

Insulator spacers 9, comprised of silicon nitride, are next formed on the sides of silicon nitride capped gate structures 6. This is accomplished via the deposition of a silicon nitride layer, at a thickness between about 500 to 1500 Angstroms, using LPCVD or PECVD procedures, followed by an anisotropic RIE procedure, using $CHF_3$—Ar, as an etchant, resulting in the formation of insulator spacers 9. Heavily doped source/drain region 10, is then formed in an area of semiconductor substrate 1, not covered by silicon nitride capped gate structures 6, or by insulator spacers 9, via ion implantation of arsenic, or phosphorous ions, at an energy between about 10 to 60 KeV, at a dose between about 1E15 to 1E16 atoms/$cm^2$. Heavily doped source/drain region, shown schematically in FIG. 3, is an N type, heavily doped source/drain region, used for NFET devices. However if SRAM PFET devices are included, a photoresist block out shape, would be used to protect the PFET region, during the formation of the NFET source/drain procedures, while another photoresist block out shape, would be used to protect the NFET regions, from the P type ion implantation procedures used to create P type, heavily doped source/drain regions, for the SRAM PFET devices.

Figure 4:
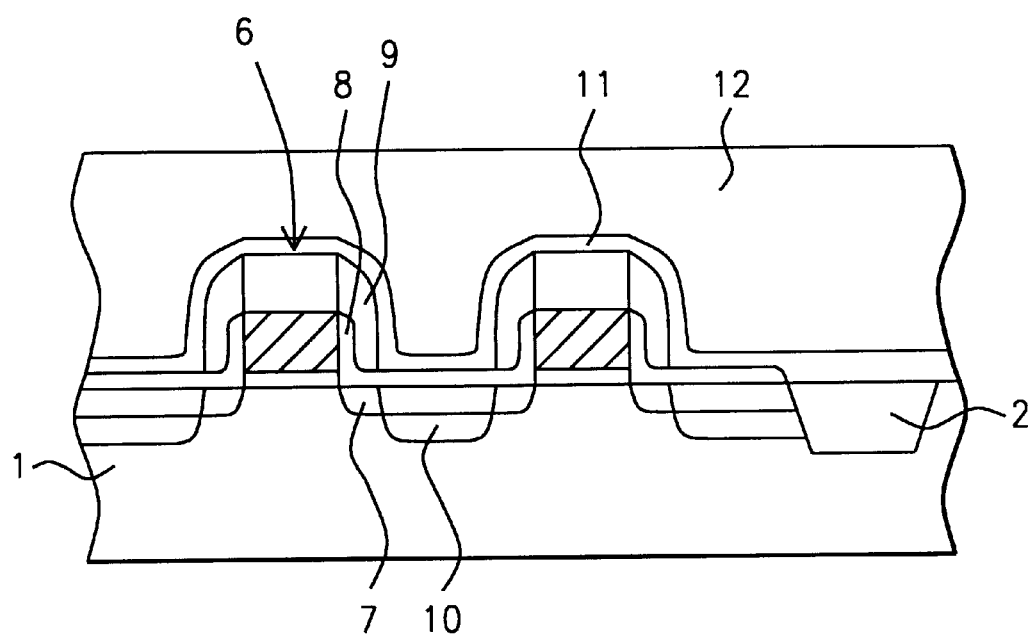

Thin silicon nitride layer 11, shown schematically in FIG. 4, is next deposited via LPCVD or PECVD procedures, to a thickness between about 100 to 400 Angstroms. Thin silicon nitride layer 11, will be used as an etch stop layer, during the subsequent formation of a self-aligned contact, (SAC), opening. Interlevel dielectric, (ILD), layer 12, is next deposited. ILD layer 12, is comprised of an underlying undoped silicon oxide layer, obtained via PECVD procedures, using tetraethylorthosilicate, (TEOS), as a source, at a thickness between about 1000 to 2000 Angstroms, and is also comprised of an overlying borophosphosilcate layer, obtained via PECVD procedures, at a thickness between about 3000 to 12000 Angstroms, again using TEOS, as well as diborane, and phosphine, as a source. Planarization of ILD layer 12, is next addressed via a reflow anneal procedure, performed at a temperature between about 700 to 850° C., followed by either a chemical mechanical polishing, (CMP), procedure, or a RIE etch back procedure, using $CHF_3$ as an etchant, resulting in a smooth top surface topography for ILD layer 12. This is schematically shown in FIG. 4.

Figure 5:
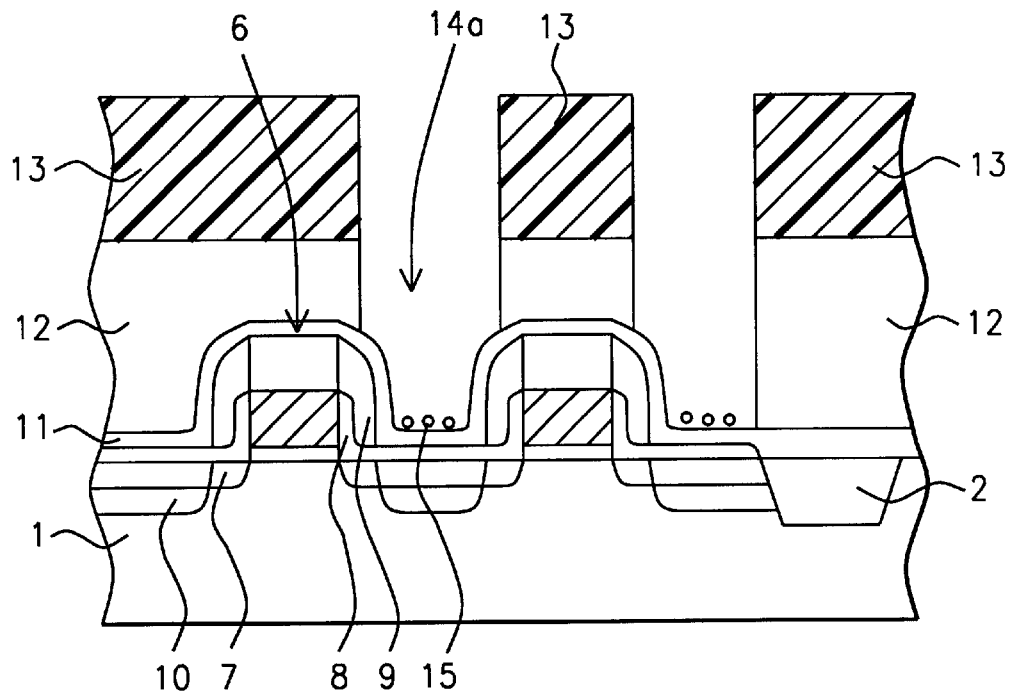
Figure 6:
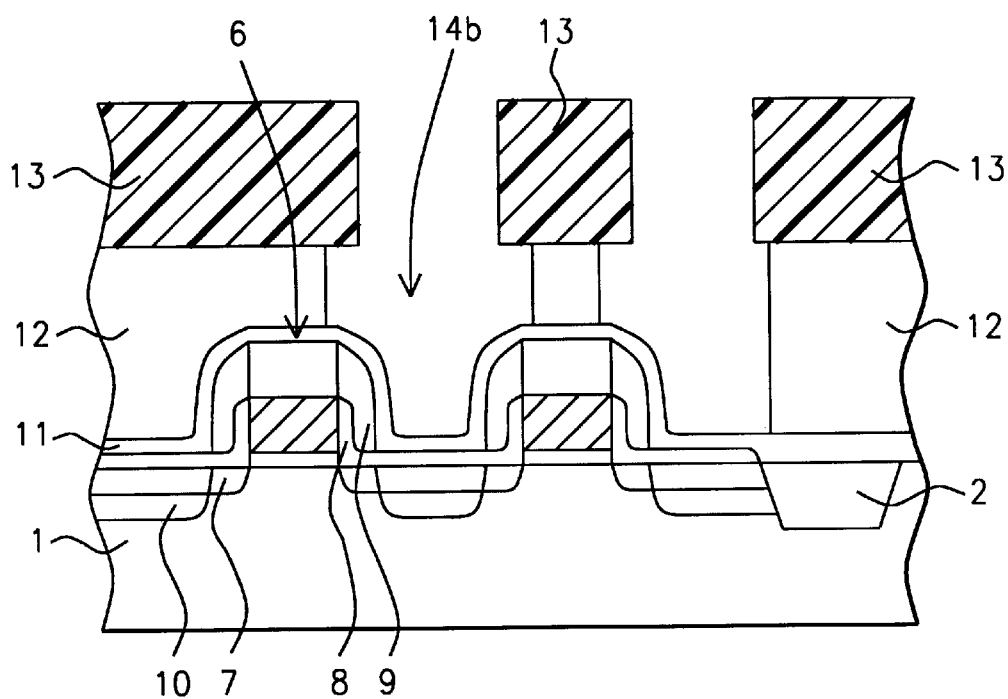
Figure 7:
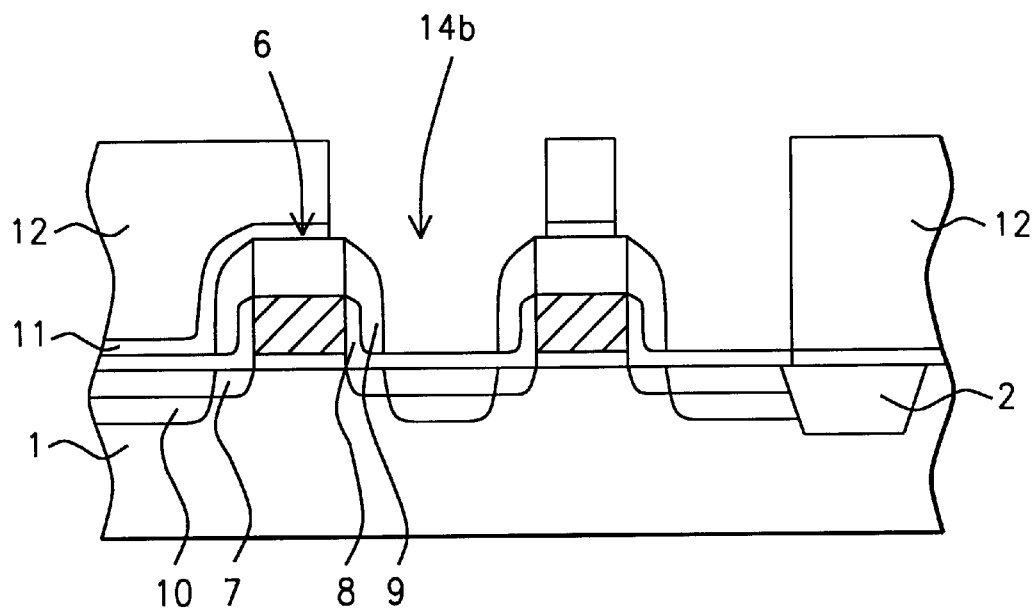

The creation of a SAC opening, to an active device region in semiconductor substrate 1, will now be described, with FIGS. 5–7, schematically showing the key stages of fabrication of the SAC opening. Photoresist shape 13, with opening 14a, is used as a etch mask, to allow a first phase of the SAC opening to be accomplished in ILD layer 12. This is accomplished via an anisotropic RIE procedure, using $C_4F_8$ as an etchant for ILD layer 12, resulting in opening 14a, in photoresist shape 13, with a diameter between about 2000 to 4000 Angstroms, being transferred to ILD layer 12. The selectivity, or etch rate ratio or ILD layer 12, (silicon oxide), to thin silicon nitride layer 11, in the $C_4F_8$ ambient, is between about 10 to 25 to 1, as a result of polymer formation, on the exposed surface of thin silicon nitride layer 11. The polymer residue 15, shown schematically in FIG. 5, allows this first phase of the SAC opening to terminate at the thin silicon nitride layer, however leads to difficulties when attempting to continue the SAC opening in thin silicon nitride layer 11.

Polymer residue 15, is not easily removed using conventional photoresist removal procedures. Therefore a second phase of the SAC opening procedure, entailing the use of a wet etch procedure, is employed to remove polymer residue 15. A wet etch solution comprised of one part hydrofluoric acid, in about 50 to 100 parts of water, is used for between about 15 to 120 sec, at a temperature between about 20 to 60° C., to completely remove polymer residue 15, from the surface of thin silicon nitride layer 11. This is schematically shown in FIG. 6. The isotropic effect of the polymer removing, wet etch procedure, results in etching of exposed regions of ILD layer 12, resulting in SAC opening 14b, in ILD layer 12, now with a diameter between about 2400 to 5000 Angstroms. After removal of photoresist shape 13, via plasma oxygen ashing and careful wet cleans, exposed regions of thin silicon nitride layer 11, are removed using a blanket isotropic dry etch, during the final phase of the SAC opening procedure, resulting in the exposure of thin silicon oxide layer 8, overlying N type, heavily doped source/region 10, located at the bottom of SAC opening 14b. This is schematically shown in FIG. 7.

Figure 8:
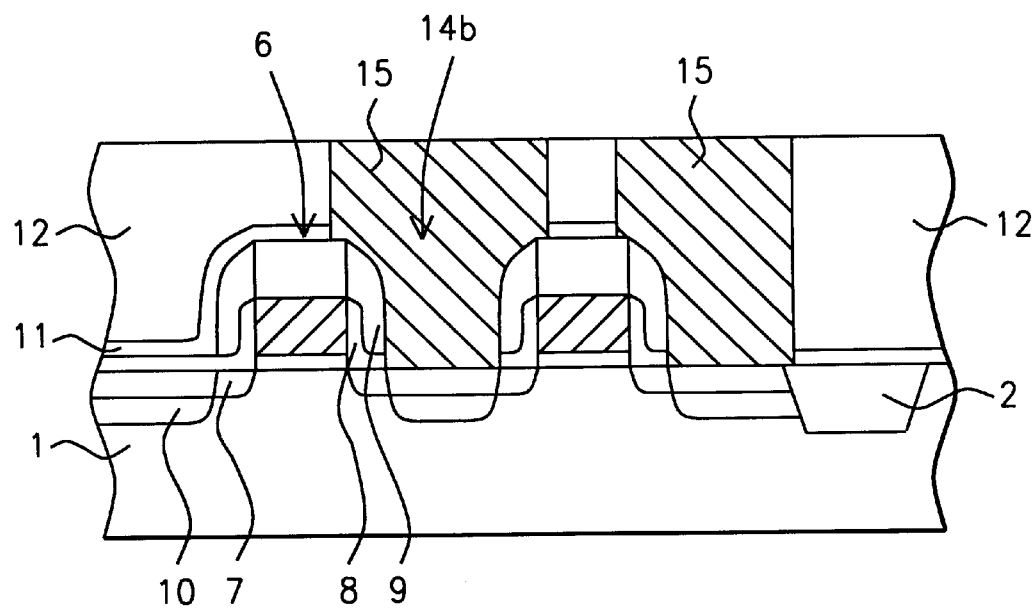

The formation of a SAC structure 15, in SAC opening 14b, is next addressed and schematically shown in FIG. 8. After a buffered hydrofluoric acid dip, used to remove the region of thin silicon oxide layer 8, exposed in SAC opening 14b, a composite adhesive—barrier layer, comprised of an adhesive layer of titanium, and a barrier layer of titanium nitride, is deposited via plasma vapor deposition, or chemical vapor deposition procedures, with the composite layer coating the exposed surfaces of SAC opening 14b. A tungsten layer is next deposited via LPCVD procedures, completely filling SAC opening 14b. Regions of the tungsten layer, and of the underlying composite adhesive—barrier layer, located on the top surface of ILD layer 12, are then removed via a chemical mechanical polishing procedure, or via a selective RIE procedure, using $Cl_2$ as an etchant, resulting in SAC structure 15, residing in SAC opening 14b.

While this invention has been particularly shown and described with reference to the preferred embodiments thereof, it should be understood by those skilled in the art that various changes in form and details may be made without departing from the spirit or scope of this invention.

What is claimed is:

1. A method of forming a self-aligned contact, (SAC), opening, in a composite insulator layer, exposing an active device region in a semiconductor substrate, comprising the steps of:

forming gate structures on an underlying gate insulator layer;

forming lightly doped source/drain regions in areas of said semiconductor substrate not covered by said gate structures;

performing an anneal cycle resulting in formation of a thin silicon oxide layer on the sides of a polysilicon component of said gate structures;

forming insulator spacers on the sides of said gate structures;

forming heavily doped source/drain regions in areas of said semiconductor substrate not covered by said gate structures or by said insulator spacers;

forming said composite insulator layer on said active device region, and the top surface of said gate structures;

performing a dry etching procedure to selectively define a first portion of said SAC opening, in a third insulator layer, of said composite insulator layer, with said dry etching procedure forming polymer material on the top surface of said second insulator layer, and with polymer material allowing said dry etching procedure to terminate at said top surface of said second insulator layer;

performing a first wet etch procedure, to selectively remove polymer material from the top surface of said second insulator, of said composite insulator layer;

selectively removing the portion of said second insulator layer, exposed in said first portion of said SAC opening, creating said SAC opening;

performing a second wet etch procedure to remove portions of a first insulator layer, exposed in said SAC opening; exposed the top surface of said active device region, located between said gate structures; and forming a self-aligned contact structure, in said SAC opening.

2. The method of claim 1, wherein said gate insulator layer is a silicon dioxide layer, obtained via thermal oxidation, at a thickness between about 15 to 200 Angstroms.

3. The method of claim 1, wherein said gate structures, are silicon nitride capped gate structures, comprised with an underlying doped polysilicon layer, at a thickness between about 500 to 2000 Angstroms, and comprised with an overlying silicon nitride layer, at a thickness between about 1000 to 2500 Angstroms.

4. The method of claim 1, wherein said insulator spacers are comprised of silicon nitride, at a thickness between about 500 to 1500 Angstroms.

5. The method of claim 1, wherein said active device region, in said semiconductor substrate, is an N type, or a P type, heavily doped source/drain region.

6. The method of claim 1, wherein said first insulator layer, of said composite insulator layer, is a silicon oxide layer, formed during an anneal procedure, in an oxygen-steam ambient, to a thickness between about 30 to 300 Angstroms.

7. The method of claim 1, wherein said second insulator layer, of said composite insulator layer, is a silicon nitride layer, obtained via LPCVD or PECVD procedures, at a thickness between about 100 to 400 Angstroms.

8. The method of claim 1, wherein said third insulator layer, of said composite insulator layer, is comprised of an overlying layer of undoped silicon oxide, obtained via PECVD procedures, at a thickness between about 1000 to 2000 Angstroms, using TEOS as a source; and comprised of a borophosphosilicate layer, obtained via PECVD procedures, at a thickness between about 3000 to 12000 Angstroms, using phosphine, diborane, and TEOS as a source.

9. The method of claim 1, wherein said first portion, of said SAC opening, is selectively formed in said third insulator layer, via an anisotropic RIE procedure, using $C_4F_8$ as an etchant, with the selectivity, or etch rate ratio, of said third insulator layer, to said second insulator layer, between about 10 to 25, to 1.

10. The method of claim 1, wherein the diameter of said first portion of said SAC opening, in said third insulator layer, is between about 2000 to 4500 Angstroms.

11. The method of claim 1, wherein said first wet etch procedure, used to remove polymer material from the top surface of said second insulator layer, is performed in a solution comprised of one part hydrofluoric acid, and between about 50 to 100 parts water, with said first wet etch procedure performed at a temperature between about 20 to 60° C., for a time between about 15 to 120 sec.

12. The method of claim 1, wherein said second insulator layer is selectively removed via a blanket isotropic dry etch procedure.

13. The method of claim 1, wherein the diameter of said SAC opening is between about 2400 to 5000 Angstroms.

14. The method of claim 1, wherein said second wet etch procedure, used to remove said first insulator layer, is performed using a buffered hydrofluoric acid solution.

15. A method of forming a SAC opening in a composite insulator layer, on a semiconductor substrate, with said composite imitator layer comprised of an overlying thick silicon oxide layer, a thin silicon nitride stop layer, and an underlying thin silicon oxide layer, and featuring the use of a wet etch procedure, used to remove polymer material, formed during the creation of a first portion of said SAC opening in said thick silicon oxide layer, via a dry etching procedure, comprising the steps of:

providing silicon nitride capped gate structures, on an underlying silicon dioxide gate insulator layer;

forming a lightly doped source/drain region in an area of said semiconductor substrate, not covered by said silicon nitride capped gate structures;

performing an anneal cycle resulting in the formation of said thin silicon oxide layer on the top of said lightly doped source/drain region, and on the sides of a polysilicon component of said silicon nitride capped gate structures;

forming silicon nitride spacers on the sides of said silicon nitride capped gate structures;

forming a heavily doped source/drain region in an area of said semiconductor substrate, not covered by said silicon nitride capped gate structures, or by said silicon nitride spacers;

depositing said thin silicon nitride stop layer;

depositing said thick silicon oxide layer;

reflowing of said thick silicon oxide layer;

planarizing said thick silicon oxide layer;

performing said dry etching procedure, using $C_4F_8$ as an etchant, to selectively define the first portion of said SAC opening in said thick silicon oxide layer, and foxing said polymer material on the surface of said thin silicon nitride stop layer;

performing said wet etch procedure, in a hydrofluoric acid solution at a temperature between about 20 to 60° C., to remove said polymer material from the surface of said thin silicon nitride stop layer;

removing a portion of said thin silicon nitride stop layer, exposed in said first portion of said SAC opening, creating said SAC opening;

performing a wet etch dip to remove a portion of said thin silicon oxide layer, exposed in said SAC opening; exposing the top surface of said heavily doped source/drawn region, exposed at the bottom of said SAC opening, and forming a self-aligned contact structure, in said SAC opening, with said self-aligned contact structure overlying, and contacting, said heavily doped source/drain region, exposed at the bottom of said SAC opening.

16. The method of claim 15, wherein said thin silicon oxide layer is formed at a thickness between about 30 to 300 Angstroms, via anneal cycle, performed at a temperature between about 750 to 900° C., in an oxygen-steam ambient.

17. The method of claim 15, wherein said thin silicon nitride stop layer is obtained via LPCVD or PECVD procedures, at a thickness between about 100 to 400 Angstroms.

18. The method of claim 15, wherein said thick silicon oxide layer is comprised of: an underlying, undoped silicon oxide layer, obtained via PECVD procedures, to a thickness between about 1000 to 2000 Angstroms, using TEOS as a source; and comprised of an overlying borophosphosilicate layer, obtained via PECVD procedures, at a thickness between about 3000 to 12000 Angstroms, using TEOS, diborane, and phosphine, as sources.

19. The method of claim 15, wherein the reflowing of said thick silicon oxide layer is accomplished at a temperature between about 700 to 850° C.

20. The method of claim 15, wherein the planarization of said thick silicon oxide layer is accomplished via a chemical mechanical polishing procedure, or via a RIE procedure, using $CHF_3$ as an etchant.

21. The method of claim 15, wherein said first portion of said SAC opening, is defined in said thick silicon oxide layer, via an anisotropic RIE procedure using $C_4F_8$ as an etchant, with an etch rate ratio of said thick silicon oxide layer, to said thin silicon nitride stop layer, of between about 10 to 25, to 1.

22. The method of claim 15, wherein the diameter of said first portion of said SAC opening is between about 2000 to 4500 Angstroms.

23. The method of claim 15, wherein said polymer material is removed from the surface of said thin silicon nitride stop layer, via said wet etch procedure, using a solution comprised of one part hydrofluoric acid, to between about 50 to 100 parts water, performed at a temperature between about 20 to 60° C., for a time between about 15 to 120 sec.

24. The method of claim 15, wherein the portion of said thin silicon nitride layer, exposed in said first portion of said SAC opening, is removed via a blanket isotropic dry etch procedure.

25. The method of claim 15, wherein the diameter of said SAC opening is between about 2400 to 5000 Angstroms.

26. The method of claim 15, wherein said wet etch dip, used to remove the portion of said thin silicon oxide layer, exposed in said SAC opening, is performed using a buffered hydrofluoric acid solution.

* * * * *